United States Patent [19]
Campbell et al.

[11] Patent Number: 5,573,631
[45] Date of Patent: Nov. 12, 1996

[54] MANUALLY-OPERABLE DE-LAMINATOR APPARATUS

[75] Inventors: Colin C. Campbell, Rochester, N.Y.; Lawrence P. Pate, Amersham, England

[73] Assignee: Eastman Kodak Company, Rochester, N.Y.

[21] Appl. No.: 347,927

[22] Filed: Dec. 1, 1994

[51] Int. Cl.⁶ .................................................. B32B 35/00
[52] U.S. Cl. .................. 156/583.1; 156/344; 156/584; 271/280; 271/281; 271/285; 430/256; 396/661
[58] Field of Search ..................... 156/344, 584, 156/583.1; 271/280, 281, 285; 354/354; 430/256, 257, 258, 259, 260, 261, 262

[56] References Cited

U.S. PATENT DOCUMENTS

| | | | |
|---|---|---|---|
| 3,266,797 | 8/1966 | Stievenart | 156/584 X |
| 3,452,980 | 7/1969 | Yanagawa | 271/285 |
| 4,526,634 | 7/1985 | Beer | 156/344 |
| 5,169,474 | 12/1992 | Binder | 156/344 |
| 5,203,942 | 4/1993 | DeCook et al. | |
| 5,478,428 | 12/1995 | Carpenter | 156/344 |
| 5,478,434 | 12/1995 | Kerr et al. | 156/344 X |

FOREIGN PATENT DOCUMENTS 2165369  4/1986  United Kingdom .................. 156/344

*Primary Examiner*—Mark A. Osele
*Attorney, Agent, or Firm*—Milton S. Sales

[57] ABSTRACT

A laminating system for bonding, to receiver stock, a lamination sheet of the type including a carrier and a material to be applied to the receiver stock, and for subsequently de-laminating the carrier from the receiver stock after the material has been applied to the receiver stock, includes a fuser to apply the material to the receiver stock. The leading edge of the carrier has a de-lamination leader to separate the carrier from the receiver stock as the leading edge of the sandwich emerges from the fuser. A first portion of the carrier is manually directed through a pair of idler rollers as the sandwich emerges from the fuser to form the carrier into a generally S-shaped curve so that operator attention is thereafter not needed to separate the remainder of the carrier and receiver stock.

11 Claims, 3 Drawing Sheets

MANUALLY-OPERABLE DE-LAMINATOR APPARATUS

CROSS-REFERENCE TO RELATED APPLICATION

Reference is made to commonly assigned, co-pending U.S. patent application Ser. No. 08/349,632, entitled DE-LAMINATOR APPARATUS AND METHOD WITH LEADER DIVERTER, filed concurrently herewith in the names of Kerr et al.

BACKGROUND OF THE INVENTION

1. Technical Field

This invention relates generally to de-lamination of two pieces of media which have been laminated together such as by the use of heat and/or pressure, and more particularly to the use of manually-operable means for guiding one of the two pieces about a path to peel apart the lamination.

2. Background Art

The KODAK Color Proofing Laminator is used to bond lamination sheets to receiver stock as a part of a color proofing system. The lamination sheets include a carrier and a layer of material to be applied to the receiver stock, which, in the case of Kodak Color Proofing Laminator, is a color donor. A lamination sheet is laid upon the receiver stock with the color donor side sandwiched between the carrier and the receiver stock.

As shown in FIG. 1, the leading edge of the lamination sheet and receiver stock sandwich 10 is fed into a laminator 12, and the sandwich passes completely through the nip of a pair of heated rollers, not shown. The laminated sandwich sits on an exit table 14 undisturbed until the trailing edge is cool to the touch, whereupon the top-most carrier can be peeled away from receiver stock and from the transferred color donor. Further details of this type of lamination/de-lamination system can be found in commonly-assigned, U.S. Pat. No. 5,203,942, which issued to B. DeCook et al. on Apr. 20, 1993.

While the above-described KODAK Color Proofing Laminator works well for materials that require cold peeling, there are other materials that require peeling the carrier from the receiver stock while the sandwich is hot to prevent bonding between the carrier and the receiver stock. Because of the requirement to peel the media while it is still hot, and because of the fairly small window of time during which peeling may be effected without the risk of donor pick-off (if the sandwich is too hot) or bonding of the carrier to the receiver stock (if the sandwich is too cool), there is a need for an apparatus and method for peeling the sandwich apart at the appropriate time after lamination.

In so-called "hot peel" laminators, an operator must stand by the laminator to effect delamination peel as the media emerges from the laminator. Thus, the operator's time is inefficiently used, as he or she cannot perform other duties for the entire duration of the emergence of the media.

Automatic de-laminators have been proposed to overcome this problem. Commonly assigned, co-pending U.S. patent application Ser. No.08/349,632, entitled DE-LAMINATOR APPARATUS AND METHOD WITH LEADER DIVERTER, filed concurrently herewith in the names of Kerr et al. discloses a system for automatically peeling the sandwich apart at the appropriate time after lamination. A pair of driven nip rollers receive a de-lamination leader therebetween as the sandwich emerges from the fuser to tension the carrier portion of the lamination sheet, thereby breaking the bond between the carrier and the receiver stock. Such automatic de-lamination apparatus is expensive, and there is still a need for manual de-laminators that do not require the full attention of the operator during the entire duration of the emergence of the media from the laminator but which are not as expensive as automatic de-laminators.

DISCLOSURE OF THE INVENTION

It is an object of the present invention to provide a manually-operable apparatus, for peeling the sandwich apart at the appropriate time after lamination, that does not require the full attention of the operator during the entire duration of the emergence of the media from the laminator and which is inexpensive.

According to a feature of the present invention, a laminating system for bonding, to receiver stock, a lamination sheet of the type including a carrier and a material to be applied to the receiver stock, and for subsequently de-laminating the carrier from the receiver stock after the material has been applied to the receiver stock, includes a fuser through which a sandwich of receiver stock and lamination sheet is fed to apply the material to the receiver stock. The leading edge of the carrier is separable from the receiver stock as the leading edge of the sandwich emerges from the fuser. A first portion of the carrier is manually directed through a pair of guide members as the sandwich emerges from the fuser to direct the carrier away from the receiver stock so that operator attention is thereafter not needed to separate the remainder of the carrier and receiver stock.

According to a preferred embodiment of the present invention, the guide members are a predetermined distance from the fuser so that (1) the sandwich is allowed to cool sufficiently to inhibit color pick-off while (2) effecting de-lamination before the sandwich has cooled enough to cause bonding between the carrier and the receiver stock. The guide members are configured to form the carrier into a generally S-shaped curve after it is stripped from the receiver stock, whereby the separated carrier continues away from the guide members along a path generally parallel to the path of the receiver stock. One of the guide members comprises an idler roller adjacent the path along which the sandwich emerges from the fuser, the roller being on a side of the path faced by the carrier such that the carrier can be partially wrapped back about the roller to separate the carrier from the receiver stock. The idler roller is journalled for movement toward and away from the path. The other guide member is a second idler roller forming a nip with the first roller through which the carrier can pass after separating from the receiver stock. The second roller is journalled for movement toward and away from the first roller to form a space gap through which the first portion of the carrier may be threaded and to thereafter be movable toward the first roller to close the space gap. A detent holds the second roller away from the first roller while the first portion of the carrier may be threaded. A deflector diverts the carrier around the second roller. A de-lamination leader may be associated with one edge of the lamination sheet.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed, in particular, to elements forming part of, or cooperating more directly with, apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making image proofs on a paper receiver stock, since the usual proofing practice is to make a hard copy of the image proof on paper. The present invention, however, is not limited to making hard copies of proof images on paper, since it can produce hard copies of images on a wide variety of media that may be used in the printing process.

Figure 1:
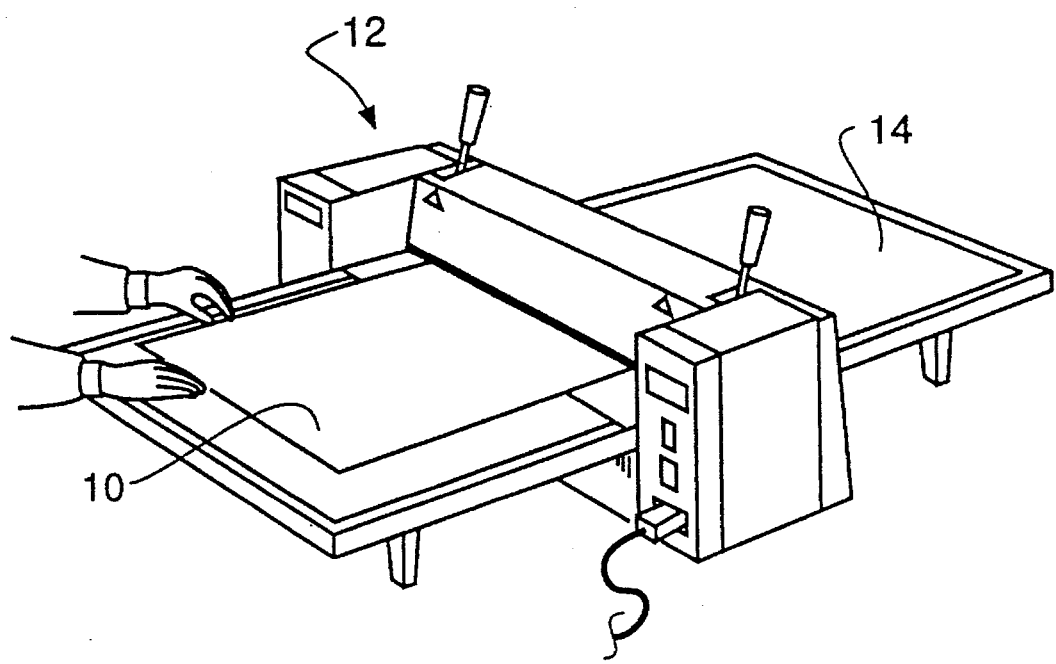
FIG. 1 is a perspective view showing a laminator known in the prior art.
Figure 2:
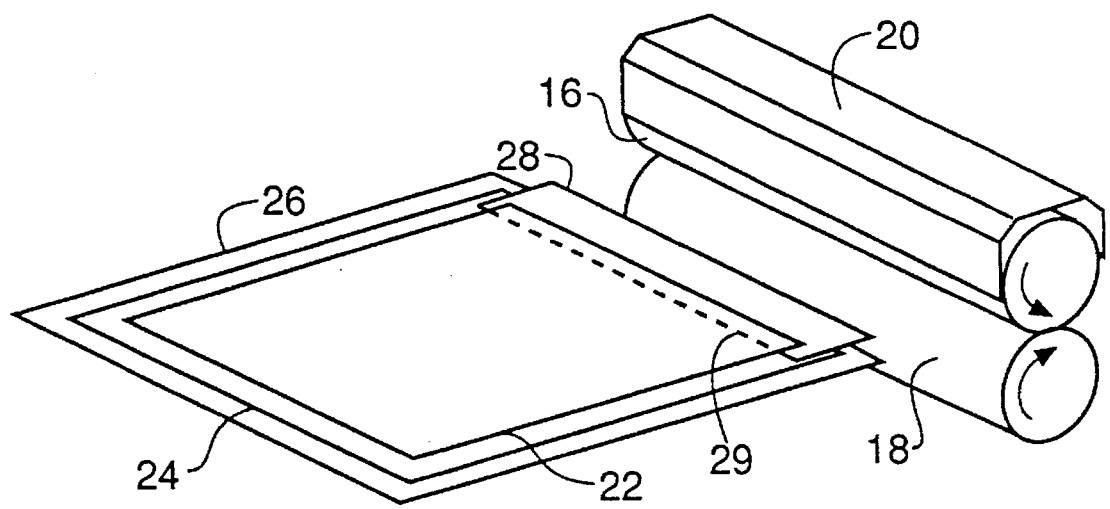
FIG. 2 is a perspective view showing the loading operation of a laminator according to a preferred embodiment of the present invention.

FIG. 2 shows a pair of heated pressure lamination rollers 16 and 18 of a laminator according to a preferred embodiment of the present invention. Roller 16 is provided with a cover 20 to protect the operator. The remainder of the laminator has been omitted from the illustration for clarity. An assembled sandwich of a lamination sheet 22 and receiver stock 24 is also shown in FIG. 2. Lamination sheet 22 includes a carrier and, on the side of the carrier facing the receiver stock, a layer of material to be applied to receiver stock 24 (such as color donor). The sandwich is assembled on a feed table (FIG. 1). Note that sandwich 10 has been illustrated as lying on an optional support sheet 26.

A de-lamination leader 28 has been inserted between the leading edge 29 of lamination sheet 22 and receiver stock 24. As will become evident further in this specification, leader 28 is provided to enable easy breakage of the bond between carrier and the receiver stock after lamination.

Leader 28 insulates lamination sheet 22 from receiver stock 24, preventing them from bonding at leading edge 29 of the lamination sheet. The material (say, color donor) to be applied to the receiver stock is laminated to the receiver stock when heat and pressure are applied to a heat-activated adhesive on the color donor.

Lamination rollers 16 and 18 contain heating elements that heat the roller surfaces. Pressure is applied to the rollers by an eccentric whose handles are shown in FIG. 1. When a lamination sheet is positioned on the receiver stock and fed into the moving rollers, the lamination sheet and receiver stock are heated and pressed together as they pass through the nip of roller pair 16, 18. Lamination image-wise transfers the adhesive and color donor from the temporary carrier to the receiver stock.

Figure 3:
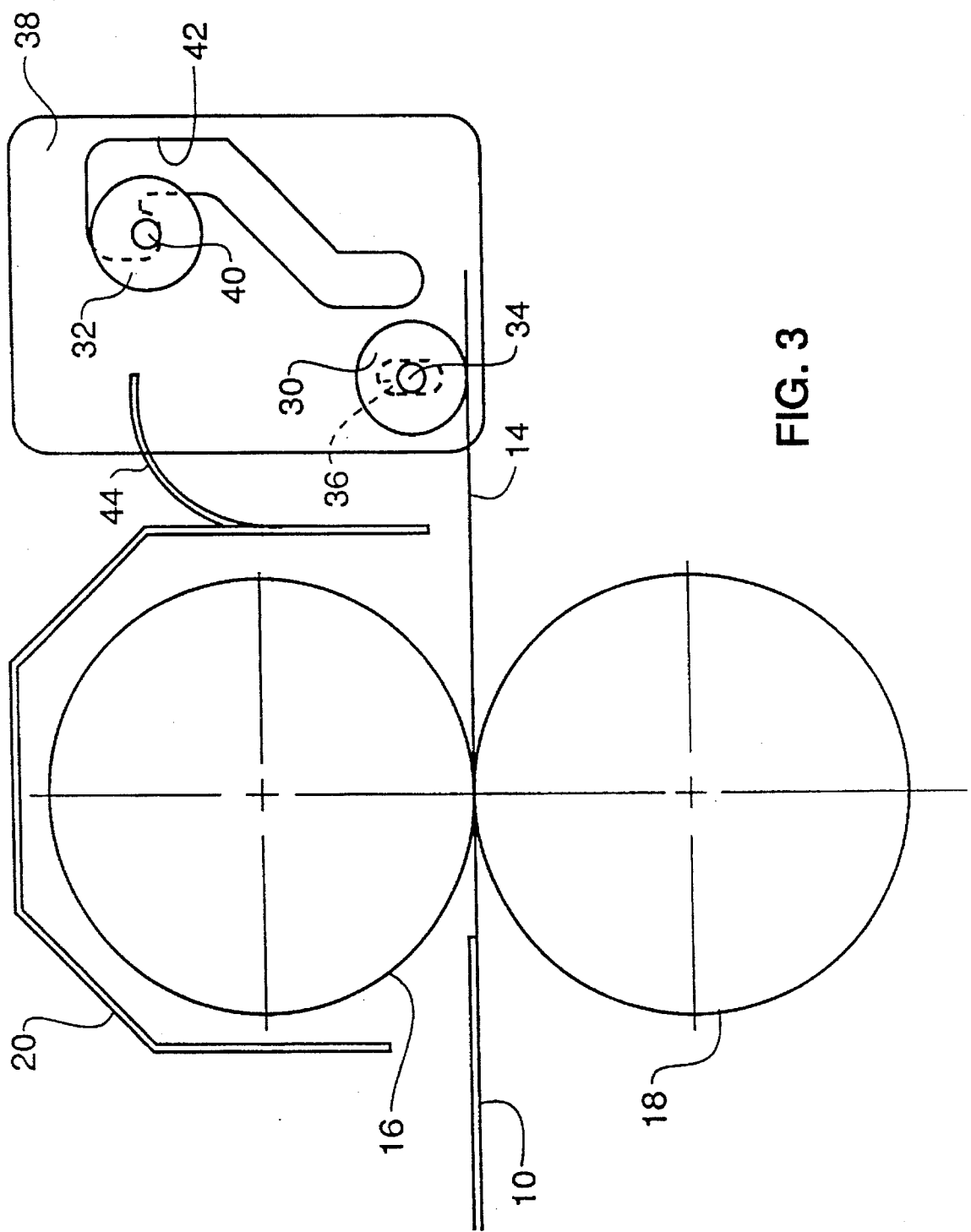
FIG. 3 is a schematic side elevational view showing details of de-lamination operation of the laminator of FIG. 2.

Referring to FIG. 3, a pair of idler rollers 30 and 32 are positioned above exit table 14 a short distance past (downstream of) the nip of pressure roller pair 16, 18. As seen in side view in FIG. 3, idler roller 30 is journalled on a shaft or shaft stubs 34 in a pair of slots 36 in a pair of end plates for vertical movement toward and away from exit table 14. The end plate nearest the viewer is not shown, and the end plate furthest from the viewer is denoted by reference numeral 38.

Similarly, idler roller 32 is journalled on a shaft or shaft stubs 40 in a pair of slots 42 for movement toward and away from exit idler roller 30. Slots 42 are shaped such that idler roller 32 can be moved away from idler roller 30 to a stable detent position as illustrated in FIG. 3. This provides a gap between the idler rollers.

Figure 4:
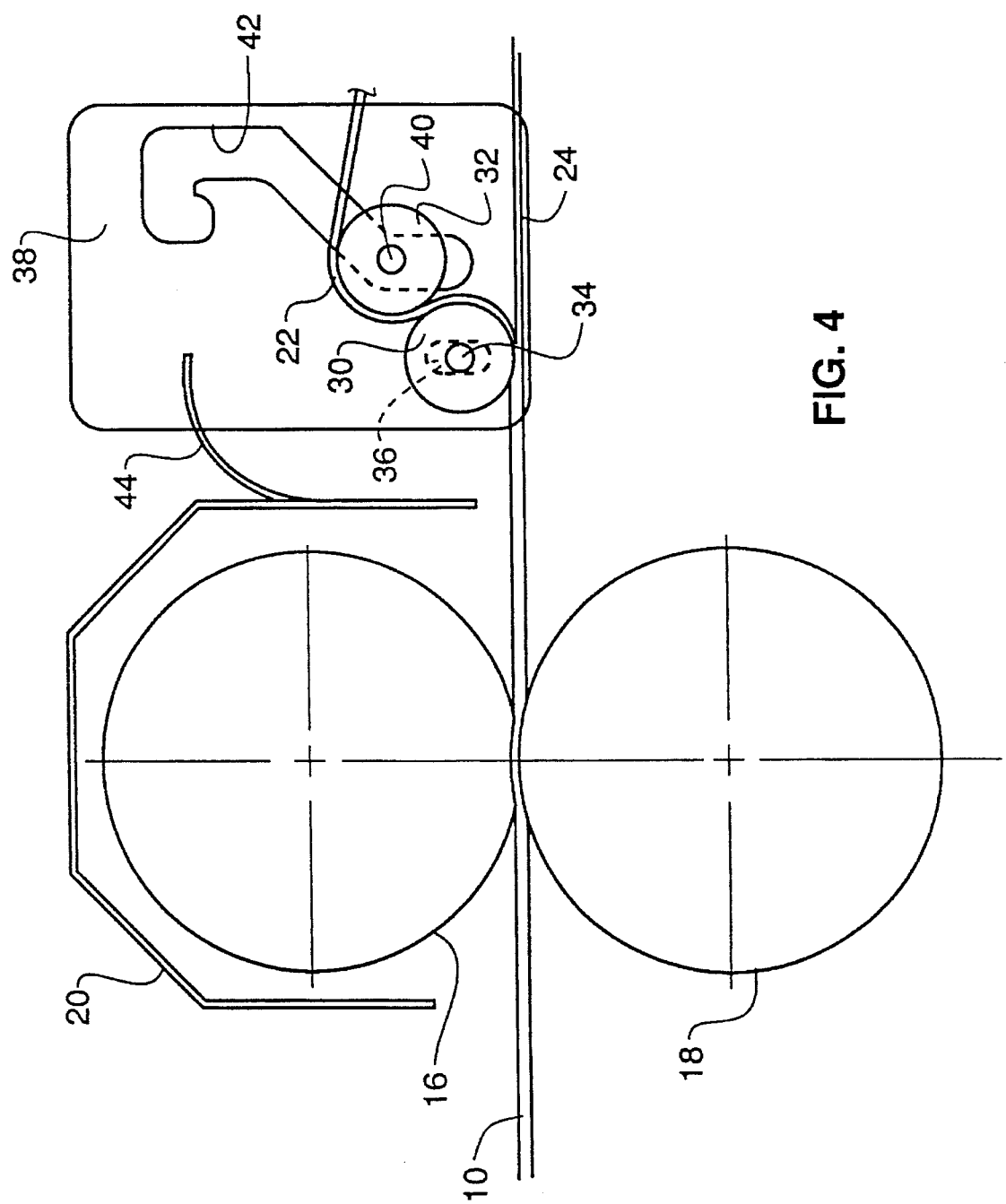
FIG. 4 is a schematic side elevational view similar to FIG. 3 at another stage in the de-lamination process.

During the initial portion of the lamination process, the shafts or shaft stubs 40 of idler roller 32 are in their FIG. 3, stable positions in upper detent portions of slots 42 so that there is a space gap between idler roller 32 and idler roller 30. As the laminated sandwich emerges from the nip of roller pair 16, 18, its de-lamination leader and leading edge passes under idler roller 30. The operator manually lifts de-lamination leader 28. As the sandwich continues to feed, the operator wraps the leading edge of the lamination sheet back over the top of idler roller 30, threading it through the space gap between the idler rollers, and behind idler roller 32. A deflector 44 guides the leading edge of the lamination sheet over the top of upper idler roller 32. Idler roller 32 may now be manually lifted from its detent and moved toward cover 20 so that it falls down slots 42 to the position shown in FIG. 4.

As receiver stock 24 emerges from the nip of roller pair 16, 18, stiffness of the receiver stock causes it to continue along the surface of exit table 14 rather than being bent around lower idler roller 30 with de-lamination leader 28. Thus, the carrier is automatically removed (stripped) from the receiver stock to cleanly separate the carrier from the receiver stock. When the carrier is peeled away, the color donor is left on the receiver stock.

The invention has been described in detail with particular reference to preferred embodiments thereof, but it will be understood that variations and modifications can be effected within the spirit and scope of the invention.

What is claimed is:

1. A laminating system for bonding, to receiver stock, a lamination sheet of the type including a carrier and a material to be applied to the receiver stock, and for subsequently de-laminating the carrier from the receiver stock after the material has been applied to the receiver stock, said laminating system comprising:

a fuser through which a sandwich of receiver stock and lamination sheet, with material to be applied to the receiver stock between the carrier of the lamination sheet and the receiver stock, is fed to apply the material to the receiver stock, the leading edge of the carrier being separable from the receiver stock as the leading edge of the sandwich emerges from the fuser; and a pair of guide members through which a first portion of the carrier may be directed as the sandwich emerges from the fuser to direct the carrier away from the receiver stock so that operator attention is thereafter not needed to separate the remainder of the carrier and receiver stock, said guide members being configured to form the carrier into a generally S-shaped curve after it is stripped from the receiver stock, whereby the separated carrier continues away from the guide members along a path generally parallel to the path of the receiver stock.

2. A laminating system as set forth in claim 1 wherein said guide members are a predetermined distance from the fuser so that (1) the sandwich is allowed to cool sufficiently to inhibit color pick-off while (2) effecting de-lamination before the sandwich has cooled enough to cause bonding between the carrier and the receiver stock.

3. A laminating system as set forth in claim 1 wherein one of said guide members comprises a roller adjacent the path along which the sandwich emerges from the fuser, the roller being on a side of the path faced by the carrier such that the carrier can be partially wrapped back about the roller to separate the carrier from the receiver stock.

4. A laminating system as set forth in claim 3 wherein the roller is an idler roller.

5. A laminating system as set forth in claim 4 wherein the idler roller is journalled for movement toward and away from the path.

6. A laminating system as set forth in claim 3 wherein the other of said guide members is a second roller forming a nip with the first-mentioned roller through which the carrier can pass after separating from the receiver stock.

7. A laminating system as set forth in claim 6 wherein said first-mentioned and said second rollers are idler rollers.

8. A laminating system as set forth in claim 6 wherein the second roller is journalled for movement toward and away from the first-mentioned roller to form a space gap through which the first portion of the carrier may be threaded and to thereafter be movable toward the first-mentioned roller to close the space gap.

9. A laminating system as set forth in claim 7 further comprising detent means for holding the second roller away from the first-mentioned roller while the first portion of the carrier may be threaded.

10. A laminating system as set forth in claim 6 further comprising a deflector for diverting the carrier around the second roller wherein the guide members are configured to form the carrier into a generally S-shaped curve after it is stripped from the receiver stock to continue away from the guide members along a path generally parallel to the path of the receiver stock.

11. A laminating system for bonding, to receiver stock, a lamination sheet of the type including a carrier, a material to be applied to the receiver stock, and a de-lamination leader associated with one edge of the lamination sheet; and for de-laminating the carrier from the receiver stock after the material has been applied to the receiver stock, said laminating system comprising:

a fuser through which a sandwich of receiver stock and lamination sheet, with material to be applied to the receiver stock between the carrier of the lamination sheet and the receiver stock, is fed with the de-lamination leader and the one edge facing in the direction of feed to apply the material to the receiver stock, the de-lamination leader and the leading edge of the carrier being separable from the receiver stock as they emerge from the fuser; and a pair of guide members through which the de-lamination leader and a first portion of the carrier may be directed as the sandwich emerges from the fuser to direct the carrier away from the receiver stock so that operator attention is thereafter not needed to separate the remainder of the carrier and receiver stock, said guide members being configured to form the carrier into a generally S-shaped curve after it is stripped from the receiver stock, whereby the separated carrier continues away from the guide members along a path generally parallel to the path of the receiver stock.

* * * * *